United States Patent
Wang et al.

(10) Patent No.: US 7,804,969 B2
(45) Date of Patent: Sep. 28, 2010

(54) SILICON MICROPHONE WITH IMPACT PROOF STRUCTURE

(75) Inventors: Zhe Wang, Singapore (SG); Yubo Miao, Singapore (SG)

(73) Assignee: Shandong Gettop Acoustic Co., Ltd., Shandong (CN)

( * ) Notice: Subject to any disclaimer, the term of this patent is extended or adjusted under 35 U.S.C. 154(b) by 1087 days.

(21) Appl. No.: 11/500,114

(22) Filed: Aug. 7, 2006

(65) Prior Publication Data
US 2008/0031476 A1 Feb. 7, 2008

(51) Int. Cl.
*H04R 25/00* (2006.01)
(52) U.S. Cl. .................. 381/174; 381/191; 381/369
(58) Field of Classification Search ......... 381/173–176, 381/190–191, 369; 361/283.3; 367/170, 367/180
See application file for complete search history.

(56) References Cited

U.S. PATENT DOCUMENTS

| | | | |
|---|---|---|---|
| 6,812,620 B2 * | 11/2004 | Scheeper et al. ............ | 381/174 |
| 6,870,937 B1 * | 3/2005 | Hirosaki et al. ............. | 381/174 |
| 6,987,859 B2 * | 1/2006 | Loeppert et al. ............ | 381/174 |
| 7,224,812 B2 * | 5/2007 | Chang ........................ | 381/174 |
| 2006/0093170 A1 | 5/2006 | Zhe et al. | |
| 2006/0093171 A1 | 5/2006 | Zhe et al. | |

\* cited by examiner

*Primary Examiner*—Suhan Ni
(74) *Attorney, Agent, or Firm*—Saile Ackerman LLC; Stephen B. Ackerman

(57) ABSTRACT

Improved impact proof capability of a silicon microphone sensing element is achieved with a stopper element that limits the maximum vibration of moveable parts. The stopper has a lower anchor portion and upper finger portion that is elevated a certain distance above the diaphragm and overhangs the outer edges of the perforated plates. The stopper is formed on a stack consisting of a lower substrate, a middle dielectric layer, and an upper membrane layer. There is a back hole in the substrate and an air gap in the dielectric layer to allow sound to impinge on the diaphragm. The number of fingers and composition of the stopper is variable. Optionally, the stopper has a center support design and is formed on a center anchor within an opening in the diaphragm. An upper finger region overhangs the diaphragm near the center opening and thereby prevents breakage due to large vibrations.

6 Claims, 3 Drawing Sheets

SILICON MICROPHONE WITH IMPACT PROOF STRUCTURE

RELATED PATENT APPLICATIONS

This application is related to the following: Ser. No. 10/977,693, filing date Oct. 29, 2004; and Ser. No. 10/977,682, filing date Oct. 29, 2004.

FIELD OF THE INVENTION

The invention relates to a sensing element of a silicon condenser microphone and a method for making the same, and in particular, to a silicon microphone structure without a dedicated backplate that has perforated plates attached directly to a movable diaphragm and reinforcements or stoppers overhanging the outer edge of the perforated plates to prevent breakage from large diaphragm movements.

BACKGROUND OF THE INVENTION

In the fast growing consumer electronic product market, there is increasing competition not only in product functionality but also in product reliability performance. For hand held electronic gadgets, the impact proof requirement is becoming more and more stringent. It is not unusual now to require a hand held device like a mobile phone to survive the impact from a 5000 gram weight and/or a free drop from a height of 1.5 meters to a steel plate, a process that can be repeated up to 10 times during a test.

One such electronic device, a backplateless silicon microphone, was disclosed by Wang et al. in Altus patent application AL04-001 and features a movable diaphragm which is supported at its edges, corners, or center by mechanical springs that are anchored to a conductive substrate through rigid pads. However, the mechanical springs may be broken in this configuration if there is a large movement in the suspended diaphragm resulting from an impact. Thus, it is necessary to improve the design of such a structure to incorporate features that will improve the durability of the device. The present invention addresses the need to enhance the impact stability of a backplateless silicon microphone.

SUMMARY OF THE INVENTION

One objective of the present invention is to provide a microphone sensing element without a dedicated backplate component that has a stopper feature which prevents a large movement in the suspended diaphragm, springs, and perforated plates from breaking the device.

A further objective of the present invention is to provide a stopper feature design that is versatile in shape and location relative to the suspended elements.

These objectives are achieved with a microphone sensing element which in its most basic embodiment features a movable diaphragm that is supported at its edges or corners by mechanical springs that are anchored to a conductive substrate through rigid pads. Each pad is disposed on a dielectric layer which acts as a spacer to define an air gap between the diaphragm and substrate. Attached to the sides of the diaphragm are perforated plates made from the same material layer as the diaphragm, pads, and mechanical springs. One or more of the pads have an overlying first electrode which is an island of a conductive metal that is connected by wiring to external circuitry. A second electrode of the same material composition is formed on the conductive substrate and is wired to complete a variable capacitor circuit with the first electrode. In one embodiment, the diaphragm, perforated plates, pads, and mechanical springs are coplanar and are made from the same silicon membrane layer and the dielectric spacer is an oxide layer. Both the diaphragm and perforated plates may be rectangular in shape. The perforated plates are positioned between adjacent mechanical springs. Perforations preferably comprise multiple rows and columns of holes. An air gap exists in the dielectric spacer layer between the substrate and the perforated plates and a back hole is formed in the substrate below the diaphragm so that a sound signal has a free path to the diaphragm and thereby induces vibrations in the diaphragm. The diaphragm, mechanical springs, and perforated plates move up and down (perpendicular to the substrate) in a concerted motion during a vibration. This movement results in a capacitance change between the first and second electrodes which can be converted into an output voltage.

A key feature of the first embodiment is a set of stopper structures that are positioned along the outer edge of the perforated plates. Each stopper has an anchor portion that is formed on and attached to a membrane layer which is coplanar with the perforated plates. Attached to the anchor portion and overhanging the perforated plate by a certain distance are one or more suspended fingers which are a second portion of each stopper structure. The shape, position, and number of fingers are variable and dependent upon the impact proof requirement. The stoppers may be comprised of a plated metal but are not limited to metal. In one aspect where there is a rectangular shaped perforated plate attached to each of the four sides of a diaphragm, at least one stopper is formed adjacent to each perforated plate.

In a second embodiment, a center stopper is configured to restrain the diaphragm due to any impact. The center stopper also has an anchor portion which is attached to a center rigid anchor pad that is formed on the substrate at the center of the diaphragm and is mechanically separated from the diaphragm. The center stopper has a plurality of fingers that overlap and overhang the center of the diaphragm. A plurality of back holes is formed below the diaphragm. The center rigid anchor pad may be circular in shape but could also be a square or another shape. The thickness of the dielectric spacer layer defines the thickness of the air gap between the diaphragm and substrate.

The rigid center anchor is supported from below by a substrate region which is connected to the surrounding substrate by a plurality of bridges that join together at a substrate anchor region.

DETAILED DESCRIPTION OF THE INVENTION

The present invention is a stopper structure for a backplate-less microphone sensing element that prevents suspended components such as mechanical springs, and a diaphragm with attached perforated plates from breakage due to large movements. The figures are not necessarily drawn to scale and the relative sizes of various elements in the structures may be different than in an actual device. The present invention is related to the discovery that a high performance microphone sensing element may be constructed without a dedicated backplate component. The inventors have previously disclosed several embodiments of such a device in Altus patent applications AL04-001 and AL04-002 which are herein included by reference in their entirety.

Figure 1:
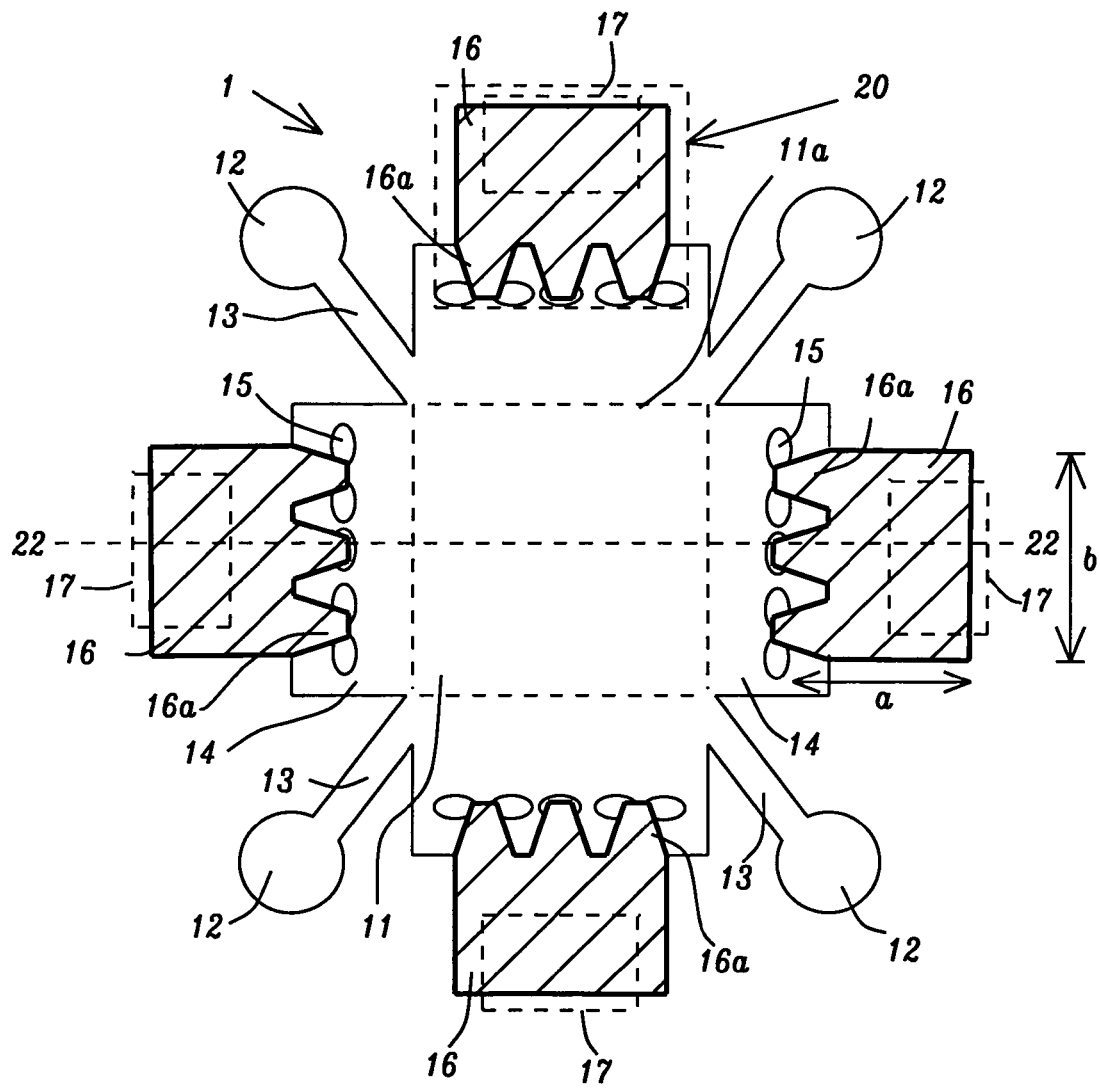
FIG. 1 is a top view depicting a set of stopper structures with the fingers overhanging the outer edges of the perforated plates that are attached to a suspended diaphragm according to one embodiment of the present invention.

Referring to FIG. 1, a first embodiment of the microphone sensing element having a stopper support structure is depicted. The microphone sensing element 1 is constructed on a substrate (not shown from a top view) such as silicon which preferably has low resistivity. Optionally, the substrate may be glass with a conductive layer formed thereon. The microphone sensing element 1 is based on a membrane film that is fabricated into a diaphragm, mechanical springs, perforated plates, and pads. In the exemplary embodiment, the diaphragm 11 is essentially planar, has a square shape, and is made of silicon, polysilicon that may be doped, Au, Ni, Cu, or other metal materials. Alternatively, the diaphragm 11 may have a rectangular or circular shape. The corner design shown in FIG. 1 comprises a diaphragm 11 that is supported at each of its four corners by mechanical springs 13 which are made of the same material and have the same thickness as the diaphragm. The mechanical springs 13 are formed along two axes (not shown) that connect opposite corners of the diaphragm and pass through the center of the diaphragm. Each mechanical spring 13 may have a rectangular shape as depicted, or a "U" or "L" shape that terminates in an anchor pad hereafter referred to as a pad 12 that is comprised of the same material and has the same thickness as the diaphragm 11. For an illustrative purpose, the pads 12 are shown as having a circular shape but alternatively may be square or rectangular.

Figure 2:
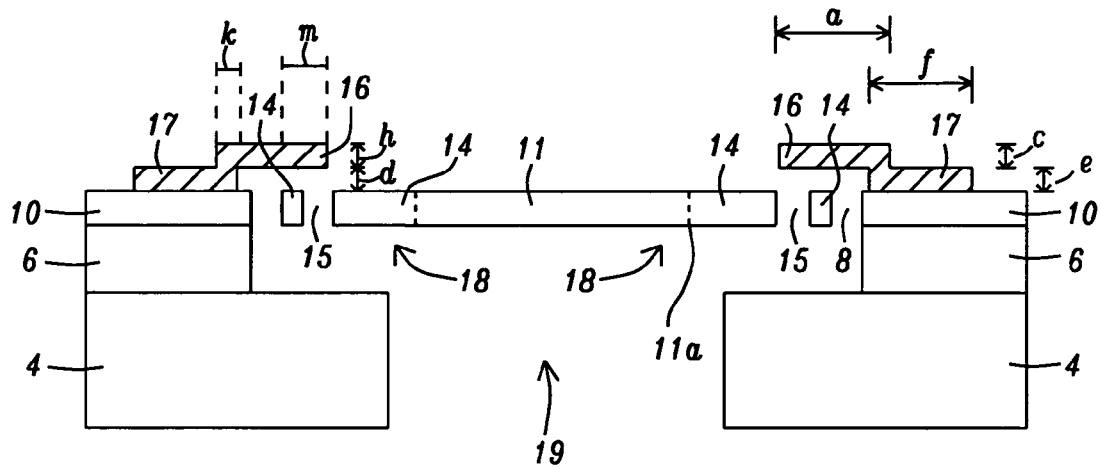
FIG. 2 is a cross-sectional view of the structure in FIG. 1 that shows a stopper with a finger attached to an anchor portion on opposite sides of the suspended diaphragm and wherein each finger overhangs a perforated plate.

Referring to FIG. 2, a cross-sectional view of FIG. 1 along the plane 22-22 is shown. A membrane layer 10 from which the diaphragm 11, perforated plates 14, pads and springs (not shown) are fabricated is anchored to a substrate 4 through a dielectric layer 6 that may be comprised of a thermal oxide, a low temperature oxide, a TEOS layer, or a PSG layer. Dielectric layer 6 serves as a spacer with an opening or air gap 18 therein to allow the diaphragm 11 having edges indicated by dashed lines 11a and perforated plates 14 to be suspended over a back hole 19 through which a sound signal may pass to induce a vibration in the diaphragm. The back hole 19 may have a vertical or a sloped sidewall relative to the back side of the substrate 4 and front side (top surface) of the substrate which faces the diaphragm 11. In other words, the back hole opening in the back side of the substrate 4 may be larger than the back hole opening in the front side of the substrate. In a silicon-on-insulator (SOI) application, the dielectric layer 6 may be comprised of silicon oxide and the substrate 4 is made of silicon. Optionally, the dielectric layer 6 may be comprised of other dielectric materials used in the art and may be a composite with a plurality of layers therein.

Returning to FIG. 1, another component of the microphone sensing element 1 is a perforated plate 14 which in the exemplary embodiment is rectangular in shape and is adjoined to each side of the diaphragm 11. Each perforated plate 14 has the same composition and thickness as the diaphragm 11. Perforations consist of holes 15 that may be arranged in multiple columns and rows. The holes are needed to allow air ventilation and thus reduce the air damping in the narrow air gap 18 (FIG. 2) during vibrations. Note that only two rows of holes 15 are shown in each perforated plate 14 in order to simplify the drawing.

There is a contact or first electrode (not shown) comprised of metal layers like Cr/Au above each pad 12 that serves as a connecting point to external wiring. Additionally, there are one or more second electrodes (not shown) with the same composition as a first electrode attached to the front side of the membrane layer 10. A first electrode and second electrode are connected by wiring (not shown) to form a variable capacitor circuit. It should be understood that a silicon condenser microphone is also comprised of a voltage bias source (including a bias resistor) and a source follower preamplifier but these components are not shown in order to simplify the drawing and direct attention to the moveable components and stopper features in the microphone sensing element 1. A vibration in the diaphragm and other moveable components is induced by a sound signal that passes through the back hole 19 and impinges on the bottom surface of the diaphragm that faces the air gap 18. A vibration will cause a change in capacitance in the variable capacitor circuit that is converted into a low impedance voltage output by the source follower preamplifier as understood by those skilled in the art.

A key feature of the first embodiment is a set of stopper support structures 20 hereafter referred to as stoppers formed along the outer edges of the perforated plates 14. Each stopper 20 is comprised of an upper finger portion 16 and a lower anchor portion 17 formed on the membrane layer 10 (FIG. 2) that is coplanar with the perforated plates 14, pads 12, and diaphragm 11. In one aspect as illustrated in FIG. 1, there is one stopper formed adjacent to each perforated plate 14. In the exemplary embodiment, the upper finger portion 16 is shown as partially covering the lower anchor portion 17. However, the present invention also encompasses a configuration wherein the upper finger portion 16 completely covers the lower anchor portion 17. Moreover, there may be more than one stopper formed adjacent to each perforated plate 14.

The upper finger portion 16 is further characterized as having a width a in a direction parallel to the plane 22-22 and a length b perpendicular to the width a. Typically, b>a, and b is less than or equal to the length of the perforated plate edge that it overhangs. Note that fingers 16a are formed along one side having a length b of the upper finger portion 16 and overhang a region of the perforated plate 14. In the exemplary embodiment, there are three fingers 16a having a trapezoidal shape shown on each upper finger portion 16. However, the number of fingers 16a may vary from one to a plurality and the shape may be changed to rectangular or another functional design as appreciated by those skilled in the art.

Referring again to FIG. 2, the lower anchor portion 17 formed on the membrane layer 10 has a thickness e and a width f in a direction parallel to the plane 22-22. Note that the membrane layer 10 is separated from a perforated plate 14 by an opening 8. In addition, the lower anchor portion 17 may be set back from the opening 8 relative to the membrane layer 10 by a gap 9. The upper finger portion 16 has a thickness h that may be equivalent to thickness e but is not limited to that relationship. In the exemplary embodiment, the region of overlap or contact between the upper finger portion 16 and lower anchor portion 17 has a width k.

In this example, the upper finger region 16 is raised above the perforated plate 14 by a certain distance d. The amount of overlap m must be large enough to prevent the perforated plate 14 from moving past the upper finger region 16 during an upward movement in a direction away from the substrate 4.

In the exemplary embodiment, the stoppers 20 are made of metal. However, the stoppers may be made of other materials that have good impact resistance and have good adhesion to the membrane layer 10. As appreciated by those skilled in the art, the stoppers 20 may be formed on the membrane layer 10 after the diaphragm 11, pads 12, mechanical springs 13, and perforated plates 14 are defined by etching openings in the membrane layer. A plating metal seed layer (not shown) may be deposited globally on the membrane layer 10 and then a photoresist layer (not shown) may be coated on the plating metal seed layer. After the photoresist layer is patterned to expose portions of the plating metal seed layer and form openings corresponding to the shape of the desired stoppers 20, a selective metal plating process may be employed to form the stoppers 20. Thereafter, the photoresist layer is stripped and regions of the plating metal seed layer not covered by stoppers 20 are removed by a conventional method.

Figure 3:
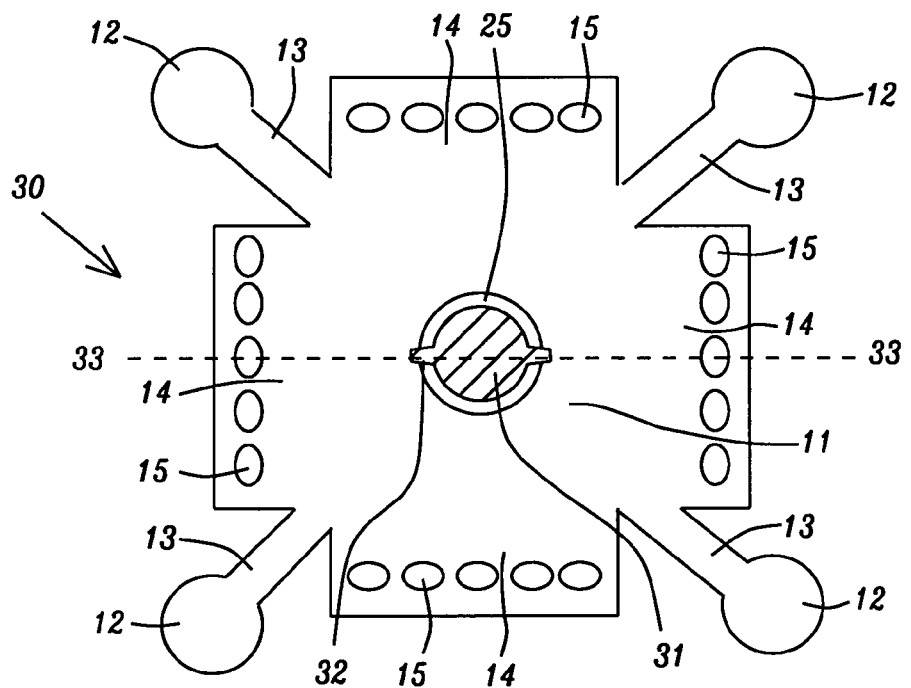
FIG. 3 is a top view illustrating a center stopper design for a microphone sensing element according to a second embodiment of the present invention.
Figure 4:
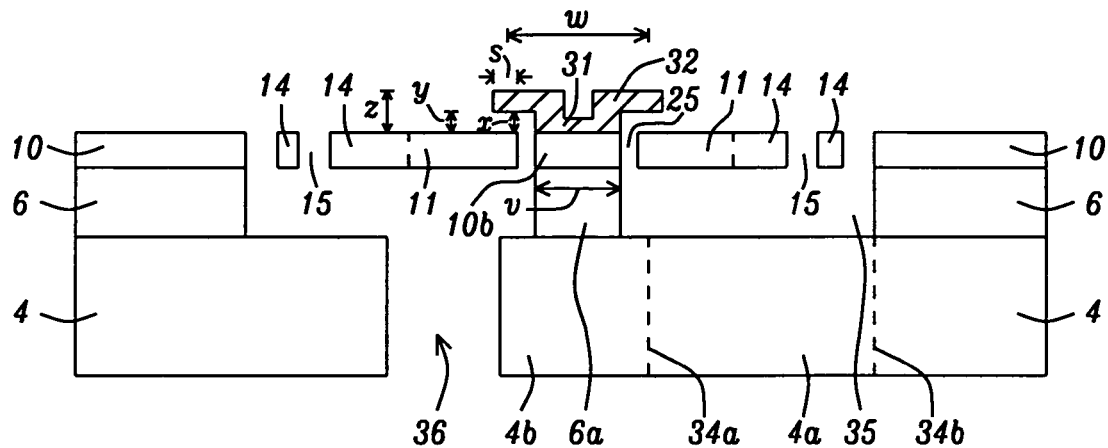
FIG. 4 is a cross sectional view of the microphone sensing element and the center stopper structure shown in FIG. 3
Figure 5:
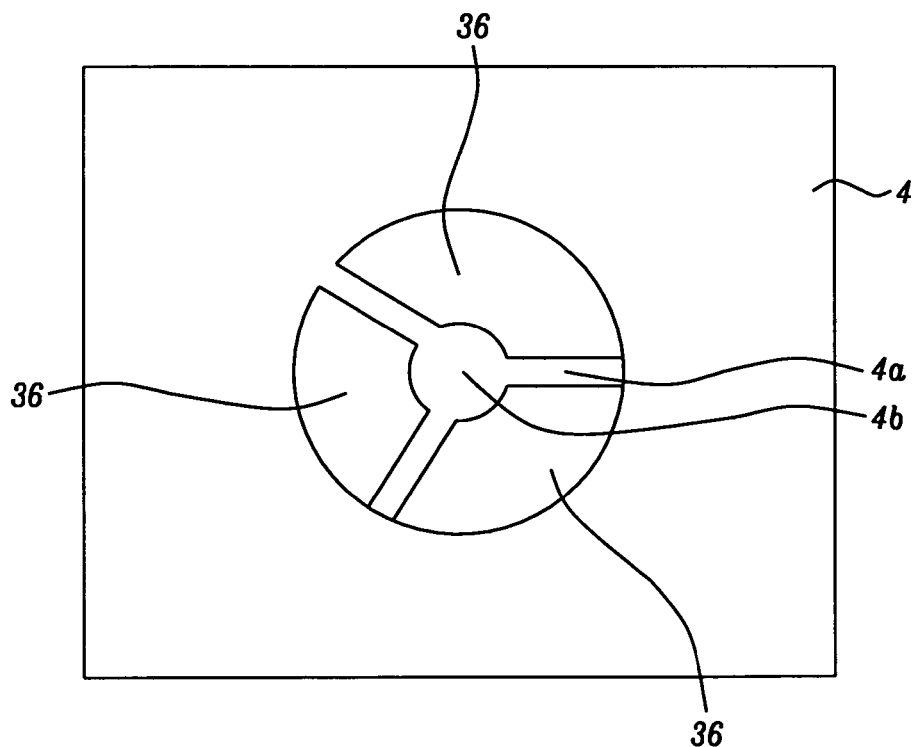
FIG. 5 is a bottom view of the substrate, substrate anchor area, and bridges to the anchor area in the microphone sensing element depicted in FIGS. 3-4.

A second embodiment of a microphone sensing element having a stopper support structure according to the present invention is depicted in FIGS. 3-5 and is based on a center stopper configuration that is a modification of the first embodiment. Instead of stoppers arranged along the outer edges of the perforated plates, a center stopper is formed at the center of the diaphragm. It should be understood that unless noted otherwise, the description of elements previously mentioned in the first embodiment carries over to the second embodiment.

Referring to FIG. 3, a microphone sensing element 30 is shown with pads 12, mechanical springs 13, and perforated plates 14 with holes 15 as described in the first embodiment. However, the diaphragm 11 has been modified with an opening 25 formed at its center. Although the opening 25 is shown as circular, the opening may have a different shape that conforms to the design selected for the center anchor support (not shown) and stopper structure that is comprised of an upper finger portion 32 and a lower base portion 31. The opening 25 and stopper structure are bisected by the plane 33-33 that passes through the center of the diaphragm 11. The upper finger portion 32 and lower base portion 31 may be made of a plated metal or another material that has good adhesion to an underlying center anchor support 10b (FIG. 4) and is strong enough to withstand an impact from the diaphragm 11 during a large vibration. Optionally, the upper finger portion 32 may be formed along a plane that bisects the opening 25 and is formed along a plane (not shown) that is perpendicular to 33-33.

Referring to FIG. 4, a cross-sectional view is shown that is taken along the plane 33-33 in FIG. 3. As mentioned previously, the diaphragm 11, pads 12, mechanical springs 13, and perforated plates 14 are all coplanar and are fabricated from the same membrane layer 10 which may be made of silicon. In this embodiment, the membrane layer 10 is formed on a dielectric spacer layer 6 that has been disposed on a substrate 4. An air gap 35 is formed by a well known sacrificial removal method of a portion of the dielectric layer 6 between the diaphragm 11 and substrate 4 and there is a back hole 36 formed in a portion of the substrate to allow a sound signal (not shown) to pass therethrough and impinge on the bottom surface of the diaphragm facing the air gap. The center anchor support for the center stopper design is comprised of a section of membrane layer 10b positioned at the center of the opening 25 and coplanar with the diaphragm 11. Note that the width v of the center anchor support 10b is designed to leave an opening 25 between the anchor support and the diaphragm 11 and thereby allow the diaphragm and other moveable components a freedom of motion in a vertical direction relative to the substrate 4.

The center anchor support 10b is made of the same material as diaphragm 11 and is formed on a section 6a of the dielectric layer. The dielectric layer 6a is formed on a portion of the substrate called the substrate anchor section 4b which is connected to the substrate 4 by a plurality of bridges 4a. Only one bridge 4a is depicted in the cross-sectional view. Bridges 4a are made of the same material as the substrate 4. Dashed lines 34a and 34b indicate the two ends of a bridge 4a that are connected to the substrate anchor section 4b and substrate 4, respectively.

Referring to FIG. 5, a bottom view of the substrate 4 below a substrate anchor section 4b is shown. In this example, three bridges 4a are used to connect the center substrate anchor section 4b with the surrounding substrate 4. Thus, the back hole 36 is divided into 3 sections. Alternatively, a plurality of bridges 4a other than three may be employed with the center support design. However, the back hole 36 must remain large enough to permit a substantial portion of a sound signal to pass through to the diaphragm 11 in order to enable an adequate sensitivity for the microphone sensing element 30.

Returning to FIG. 4, the lower base portion 31 of the center stopper and the center anchor support 10b have a smaller width than the substrate anchor section 4b due to a sacrificial release in the dielectric layer 6. The upper finger portion 32 overhangs a region of the diaphragm 11 near the opening 25 and is separated from the diaphragm by a certain distance y. Therefore, during a large vibration of diaphragm 11, the maximum movement away from the substrate 4 is limited by the distance y because of the upper finger region 32. The upper finger region may be comprised of two fingers 32 shown in FIG. 3 on opposite sides of the lower base portion 31 and along the plane 33-33. The present invention also encompasses an embodiment wherein there are more than two fingers arranged in various patterns above the lower base portion 31. Another possible configuration of the upper finger region 32 according to the present invention is a continuous overhang that is essentially a single finger formed in a circle shape on the lower base portion 31.

The stopper including lower base portion 31 and upper finger region 32 may be comprised of metal or another material that has good impact resistance and good adhesion to the membrane layer 10. A method of forming the center stopper is similar to the process sequence described in the first embodiment for forming the stoppers 20. In this embodiment, the membrane layer 10 may be etched to form the diaphragm 11, perforated plates 14, pads 12, and center opening 25. In one aspect, a plating metal seed layer (not shown) may be deposited globally on the membrane layer 10 and then a photoresist layer (not shown) may be deposited on the plating metal seed layer. Next, the photoresist layer is imaged to expose portions of the plating metal seed layer and form openings corresponding to the shape of the desired stopper structure. Thereafter, the stopper comprised of the lower base portion 31 and upper finger region 32 may be formed by a selective plating process, for example. After the photoresist layer is stripped, the regions of the plating metal seed layer not covered by the center stopper are removed by a conventional method.

Both embodiments provide an advantage over prior art in that the microphone sensing device disclosed herein has the improved impact proof capability because the amplitude of the diaphragm vibration in a direction away from the substrate is restricted by a stopper structure and thereby prevents breakage of moveable parts. Furthermore, the stopper design is versatile and can accommodate various materials for the stopper, diaphragm, and other moveable parts to enable optimum performance and durability.

While this invention has been particularly shown and described with reference to, the preferred embodiments thereof, it will be understood by those skilled in the art that various changes in form and details may be made without departing from the spirit and scope of this invention.

We claim:

1. A microphone sensing element without a dedicated backplate component, comprising:
   (a) a substrate having a front side and a back side with one or a plurality of back holes formed therein;
   (b) a dielectric spacer layer formed on the front side of the substrate;
   (c) a diaphragm that is aligned above said one or plurality of back holes and is made of a membrane layer formed on the dielectric spacer;
   (d) a plurality of perforated plates with a plurality of holes therein which adjoin the diaphragm, said perforated plates are suspended over the substrate with an air gap therebetween and are made of said membrane layer;
   (e) a plurality of mechanical springs made of said membrane layer and attached to said diaphragm wherein each mechanical spring has two ends in which one end is attached to the diaphragm and a second end is connected to a pad that is formed on the dielectric layer and anchored to the substrate; and
   (f) a plurality of stopper structures comprised of a lower anchor portion and an upper finger portion having one or a plurality of fingers that overhang the perforated plates and restrict an upward motion of the diaphragm and perforated plates away from the substrate during a vibration.

2. The microphone sensing element of claim 1 wherein said membrane layer is comprised of silicon or doped polysilicon having a low resistivity.

3. The microphone sensing element of claim 1 wherein said lower anchor portion is formed on the membrane layer.

4. The microphone sensing element of claim 3 wherein the stopper structures are made of a plated metal or another material that has good impact resistance and has good adhesion to the membrane layer.

5. The microphone sensing element of claim 1 wherein said plurality of fingers are separated from the underlying perforated plates by a certain distance.

6. The microphone sensing element of claim 1 wherein said upper finger portion overlaps a perforated plate to an extent that restricts an upward motion of the diaphragm and perforated plate in a direction away from the substrate.

* * * * *